US009397123B1

(12) United States Patent
Ding et al.

(10) Patent No.: US 9,397,123 B1
(45) Date of Patent: Jul. 19, 2016

(54) ARRAY SUBSTRATE, MANUFACTURE METHOD THEREOF, AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Hong Ding, Shanghai (CN); Lingxiao Du, Shanghai (CN); Qijun Yao, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/728,995

(22) Filed: Jun. 2, 2015

(30) Foreign Application Priority Data

Dec. 29, 2014   (CN) .......................... 2014 1 0856763

(51) Int. Cl.
| | |
|---|---|
| *G06F 3/041* | (2006.01) |
| *H01L 27/32* | (2006.01) |
| *H01L 27/12* | (2006.01) |
| *G02F 1/1333* | (2006.01) |
| *G02F 1/1368* | (2006.01) |
| *G02F 1/1362* | (2006.01) |

(52) U.S. Cl.
CPC .......... *H01L 27/1244* (2013.01); *G02F 1/1368* (2013.01); *G02F 1/13338* (2013.01); *G02F 1/133345* (2013.01); *G02F 1/136286* (2013.01); *H01L 27/1259* (2013.01); *G02F 2001/136218* (2013.01)

(58) Field of Classification Search
CPC ............ G02F 1/13338; G02F 2201/40; G02F 1/136286; G02F 1/1333; G02F 1/1343; G06F 3/0416; G06F 3/044; G06F 3/0412; H01L 27/3248; H01L 27/323
USPC .......... 349/12; 345/173, 174; 438/30; 257/40
See application file for complete search history.

(56) References Cited

U.S. PATENT DOCUMENTS

| | | | | |
|---|---|---|---|---|
| 2014/0125626 | A1* | 5/2014 | Yang ................. | G02F 1/134336 345/174 |
| 2014/0333571 | A1* | 11/2014 | Hu ........................ | G06F 3/0412 345/174 |

* cited by examiner

*Primary Examiner* — Evan Pert
*Assistant Examiner* — Changhyun Yi
(74) *Attorney, Agent, or Firm* — Anova Law Group, PLLC (57) ABSTRACT

An array substrate is disclosed. The Array substrate includes gate and data lines, where the gate lines and the data lines cross each other. The pixel units include pixel electrodes and common electrodes, and the common electrode comprises a first slot extending in a direction of the data lines. The first slot at least partially overlaps at least one of the pixel electrodes. In addition, the gate lines each include an aperture region, where the aperture region of each gate line at least partially overlaps at least one of the first slots. Furthermore, shielding electrodes and shielding branch electrodes are provided in the direction of the data lines, where the shielding electrodes at least partially overlap the data lines, and where the shielding branch electrodes are provided in the aperture region, and the shielding branch electrodes at least partially overlap the gate lines.

11 Claims, 9 Drawing Sheets

ARRAY SUBSTRATE, MANUFACTURE METHOD THEREOF, AND DISPLAY DEVICE

CROSS-REFERENCES TO RELATED APPLICATIONS

This application claims the benefit of priority to Chinese Patent Application No. 201410856763.6, filed with the Chinese Patent Office on Dec. 29, 2014 and entitled "ARRAY SUBSTRATE, MANUFACTURE METHOD THEREOF, AND DISPLAY DEVICE", the content of which is incorporated herein by reference in its entirety.

BACKGROUND OF THE INVENTION

As compared to a touch display device with a touch panel provided on a liquid crystal display panel, a touch display device with integrated touch display device and liquid crystal display panel becomes a mainstream touch display device today due to the advantages of reducing the use of substrates and having thinner thickness. Touch display devices with integrated touch display device and liquid crystal display panel include an on-cell structure and an in-cell structure. The in-cell structure refers to embedding a touch panel functionality into liquid-crystal pixels, and the on-cell structure refers to embedding a touch panel functionality between a color filter substrate and a polarizer substrate.

For a touch display device with the in-cell structure, it is required to divide the common electrode of the liquid crystal display panel into pieces to achieve the touch panel functionality, hence the common electrode is needed to be etched and slotted. Conventionally, an aperture portion is provided between two adjacent pixel units in the same row, that is, the aperture portion of the common electrode is provided between the pixel rows. Since there is a data line between two adjacent pixel units in the same row, the aperture portion faces the data line, and the aperture may cause the leakage of the electric field of the data line and the leakage of light from the display panel. The electric field of the data line can be shielded theoretically by placing metal wiring between the aperture region and the data line, but the width and the location of the metal wiring are hard to be controlled. In a case that the width of the metal wiring is too narrow or the alignment to the data line is inaccurate, the leakage of light may still occur, and the process difficulty may be increased.

BRIEF DESCRIPTION OF THE DRAWINGS

In order to illustrate the technical solutions according to the embodiments of the disclosure or in the prior art more clearly, the drawings to be used in the description of the embodiments or the prior art are described briefly hereinafter. Apparently, the drawings described hereinafter are only some embodiments of the present disclosure, and other drawings may be obtained by those skilled in the art according to those drawings without creative effort.

DETAILED DESCRIPTION OF THE PREFERRED EMBODIMENTS

Hereinafter, the technical solutions according to the embodiments of the disclosure are described clearly and completely in conjunction with the drawings of the disclosure. Apparently, the described embodiments are only a few of the embodiments of the disclosure. Any other embodiments obtained by those skilled in the art based on the embodiments of the disclosure without creative effort fall within the scope of protection of the disclosure.

An array substrate is provided according to an embodiment of the disclosure. The array substrate includes a substrate, and a plurality of gate lines and data lines are provided on the substrate. The gate lines and the data lines are insulated from each other and cross each other to define a plurality of pixel units, and the pixel units include pixel electrodes and common electrodes. A first slot is provided on the common electrode in an extension direction of the data line, and the first slot at least partially overlaps the pixel electrode. An aperture region is provided over the gate line, and the aperture region at least partially overlaps the first slot. A shielding electrode and a shielding branch electrode are provided over the data line in the extension direction of the data line, wherein the shielding branch electrode is electrically connected to the shielding electrode; A projection of the shielding electrode onto the data line at least partially overlaps the data line; the shielding branch electrode is provided in the aperture region, and a projection of the shielding branch electrode onto the gate line at least partially overlaps the gate line.

To make the technical solutions according to the embodiments of the disclosure clearer, a detailed description of the above solution is provided in conjunction with the drawings.

Figure 1:
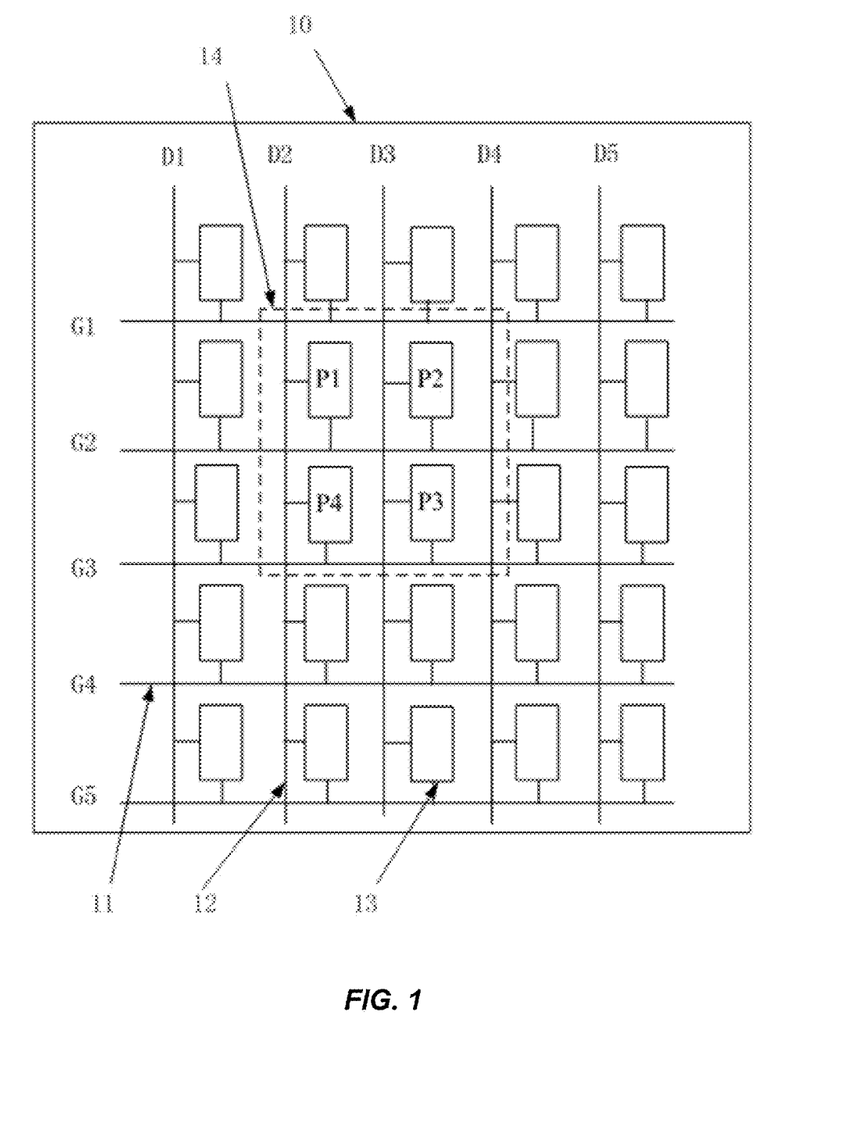
FIG. 1 is a structure diagram of an array substrate according to an embodiment of the disclosure.
Figure 2:
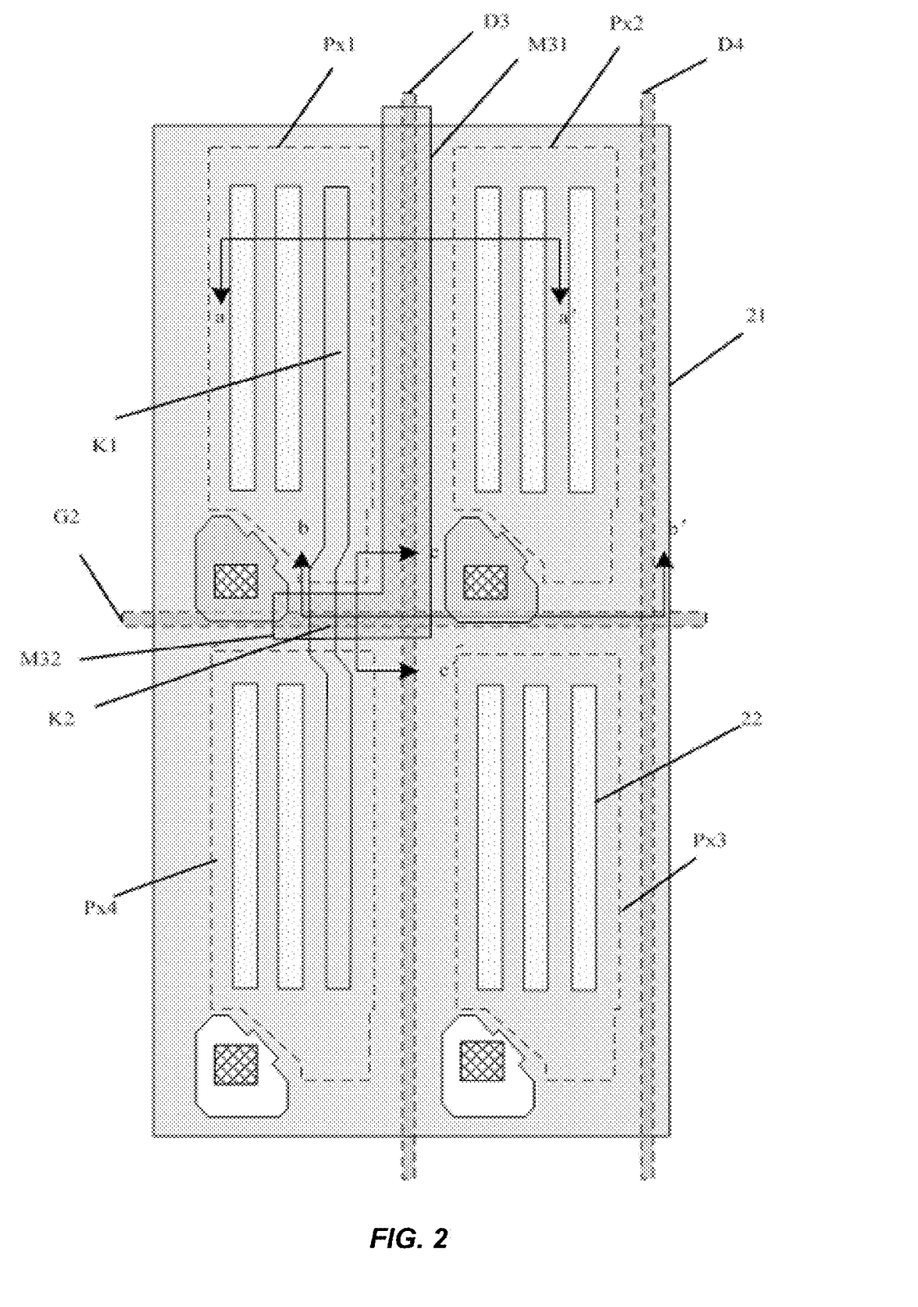
FIG. 2 is an enlarged partial view of a pixel unit structure of the array substrate shown in FIG. 1.

Referring to FIG. 1 and FIG. 2, FIG. 1 is a structure diagram of an array substrate according to an embodiment of the disclosure, and FIG. 2 is an enlarged partial view of a pixel unit structure of the array substrate shown in FIG. 1.

The array substrate includes a substrate 10, and a plurality of gate lines 11 and data lines 12 are provided on the substrate 10. The gate lines 11 and the data lines 12 are insulated from each other and cross each other to define a plurality of pixel units 13. Pixel units 13 include pixel electrodes and common electrodes.

The pixel electrodes of the respective pixel units 13 are fabricated via a same patterned pixel electrode layer (may be ITO layer), and the common electrodes of the respective pixel units 13 are fabricated via a same patterned common electrode layer 21 (may be ITO layer).

The plurality of pixel units 13 include at least one first pixel unit group 14, which is a 2×2 pixel unit matrix. The first pixel unit group 14 includes a first pixel unit P1, a second pixel unit P2, a third pixel unit P3, and a fourth pixel unit P4 which are arranged clockwise. A data line D3 is provided between the first pixel unit P1 and the second pixel unit P2 and between the fourth pixel unit P4 and the third pixel unit P3; a gate line G2 is provided between the first pixel unit P1 and the fourth pixel unit P4 and between the second pixel unit P2 and the third pixel unit P3. The first pixel unit P1 includes a pixel electrode Px1, the second pixel unit P2 includes a pixel electrode Px2, the third pixel unit P3 includes a pixel electrode Px3, and the fourth pixel unit P4 includes a pixel electrode Px4.

An array structure with 5×5 pixel units is shown in FIG. 1, which has five gate lines 11 including gate lines G1-G5 and five data lines 12 including data lines D1-D5. The number of rows and columns of pixels may be any positive integer, and is not limited to that in the embodiment shown in FIG. 1.

A first slot K1 is provided on the common electrode layer 21 in the extension direction of the data line 12, and the first slot K1 at least partially overlaps the pixel electrode. The first slot may be provided on the common electrode for each pixel unit, or the first slot may be provided on the common electrode for one or more predetermined pixel units.

An aperture region K2 is provided over the gate line 11, and the aperture region K2 at least partially overlaps the first slot K1.

A shielding electrode M31 and a shielding branch electrode M32 are provided over the data line 12 in the extension direction of the data line 12, wherein the shielding branch electrode M32 is electrically connected to the shielding electrode M31.

The projection of the shielding electrode M31 onto the data line D3 at least partially overlaps the data line D3; the shielding branch electrode M32 is provided in the aperture region K2, and the projection of the shielding branch electrode M32 onto the gate line G2 at least partially overlaps the gate line G2.

A first insulating layer is provided over the data line 12; the shielding electrode M31 and the shielding branch electrode M32 are provided on the first insulating layer, and the shielding electrode M31 and the shielding branch electrode M32 are electrically connected.

A second insulating layer with a first via hole is provided between the shielding electrode M31 and the common electrode layer 21 and between the shielding branch electrode M32 and the common electrode layer 21. The common electrode layer 21 is provided on the second insulating layer. The common electrode is electrically connected to the shielding electrode M31 or the shielding branch electrode M32 through the first via hole.

On array substrate shown in FIG. 2, the pixel electrode is provided between the shielding electrode M31 and the data line 12, and the common electrode is provided over the pixel electrode. It is required to etch the common electrode and form an electrode structure including a plurality of strip electrodes 22 to generate a controllable electric field between the pixel electrode and the common electrode to drive a liquid crystal layer. The gate electrodes of the thin-film transistors of respective pixel units are provided on the substrate, and a gate insulating layer is provided on the gate electrodes. An active layer is provided on the gate insulating layer, and source electrodes and drain electrodes of the thin-film transistors of respective pixel units as well as a metal layer, on which the data lines 12 are located, are provided on the active layer. A first insulating layer is provided on the source electrodes and drain electrodes of the thin-film transistors as well as the metal layer on which the data lines 12 are located.

Figure 3:
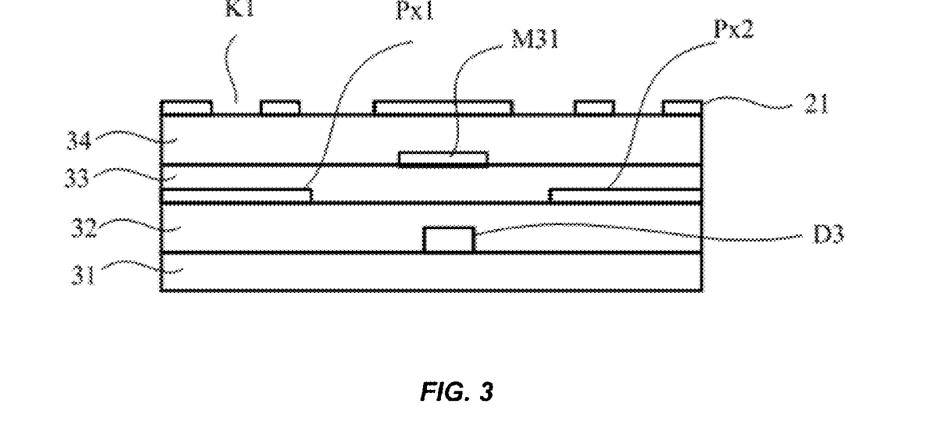
FIG. 3 is a sectional view of the array substrate shown in FIG. 2 along the direction of aa'.
Figure 4:
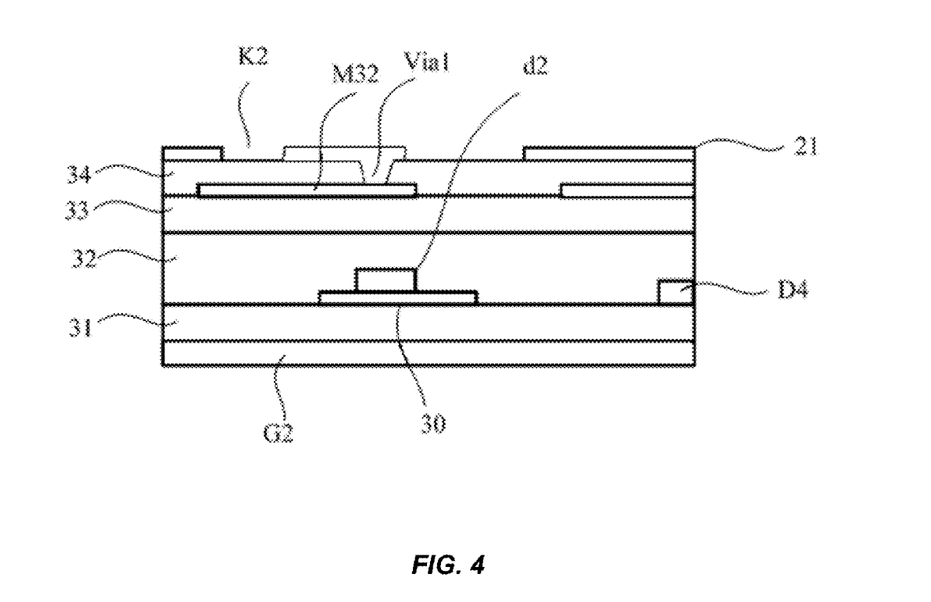
FIG. 4 is a sectional view of the array substrate shown in FIG. 2 along the direction of bb'.
Figure 5:
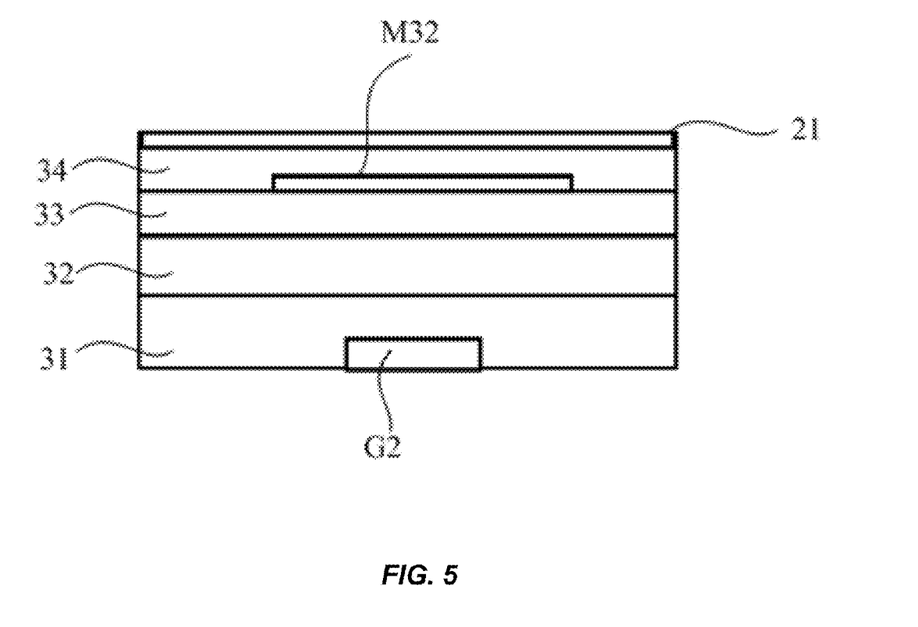
FIG. 5 is a sectional view of the array substrate shown in FIG. 2 along the direction of cc'.

Specifically, referring to FIG. 3 to FIG. 5, FIG. 3 is a sectional view of the array substrate shown in FIG. 2 along the direction of aa', FIG. 4 is a sectional view of the array substrate shown in FIG. 2 along the direction of bb', and FIG. 5 is a sectional view of the array substrate shown in FIG. 2 along the direction of cc'. In the first pixel unit group 14: the gate line G2 is provided on the substrate surface; the gate line G2 is covered with the gate insulating layer 31; the active layer 30, the drain electrode d2 of the thin-film transistor of the second pixel unit P2 and the metal layer on which the data lines D3 and D4 locates are provided on the surface of the gate insulating layer 31; the first insulating layer 32 covers the surface of the drain electrode d2 and the data lines D3 and D4; the pixel electrode Px1 of the first pixel unit P1 is provided on the surface of the first insulating layer 32 at a location corresponding to the first pixel unit P1, and the pixel electrode Px2 of the second pixel unit P2 is provided on the surface of the first insulating layer 32 at the location corresponding to the second pixel unit P2; the fourth insulating layer 33 covers the surface of the pixel electrode Px1 and the pixel electrode Px2. The shielding electrode M31 and the shielding branch electrode M32 are provided on the surface of the fourth insulating layer 33; the second insulating layer 34 covers the surface of the shielding electrode M31 and the shielding branch electrode M32, a common electrode layer 21 is provided on the surface of the second insulating layer 34, a first slot K1 is provided in the common electrode corresponding to the pixel electrode Px1, and an aperture region K2 is provided in the common electrode layer 21 over the gate line between the pixel electrodes Px1 and Px4. The common electrode includes a plurality of strip electrodes 22 in the region corresponding to the pixel units. The common electrode is electrically connected to the shielding branch electrode M32 through the first via hole Via1.

According to the implementations shown in FIG. 3 to FIG. 5, a first insulating layer 32 is provided between the pixel electrode and the drain electrode d2 of the thin-film transistor and between the pixel electrode and the metal layer on which the data line D3 locates, and the electrical connection between the pixel electrode and the drain electrode of the thin-film transistor needs to be realized through a via hole. In other embodiments, the first insulating layer 32 may be omitted, the electric connection may be achieved by overlapping part of the pixel electrode to the drain electrode of the thin-film transistor, and other parts of the pixel electrode are in the same layer as the drain electrode of the thin-film transistor.

The above is just one implementation of the disclosure; the pixel electrode may alternatively be provided over a common electrode layer according to another implementation of the disclosure, i.e., the common electrode layer is provided between the substrate of the array substrate and the pixel electrodes of respective pixel units. It is required to etch the pixel electrode and form an electrode structure including a plurality of strip electrodes to generate a controllable electric field between the pixel electrode and the common electrode to drive a liquid crystal layer. Each common electrode may be fabricated into one or more strips. In this case, the gate electrodes of the thin-film transistors of respective pixel units are provided on the substrate, a gate insulating layer is provided on the gate electrodes, an active layer is provided on the gate insulating layer, and source electrodes and drain electrodes of the thin-film transistors of respective pixel units as well as the metal layer on which the data lines locate are provided on the active layer, a first insulating layer is provided on the source electrodes and drain electrodes as well as the metal layer on which the data lines locate; a third insulating layer is provided on the common electrode layer, and a pixel electrode is provided on the third insulating layer, wherein a second via hole is provided to pass through the first, second and third insulating layers, and the pixel electrode is electrically connected to the drain electrode of the thin-film transistor through the second via hole.

Figure 6:
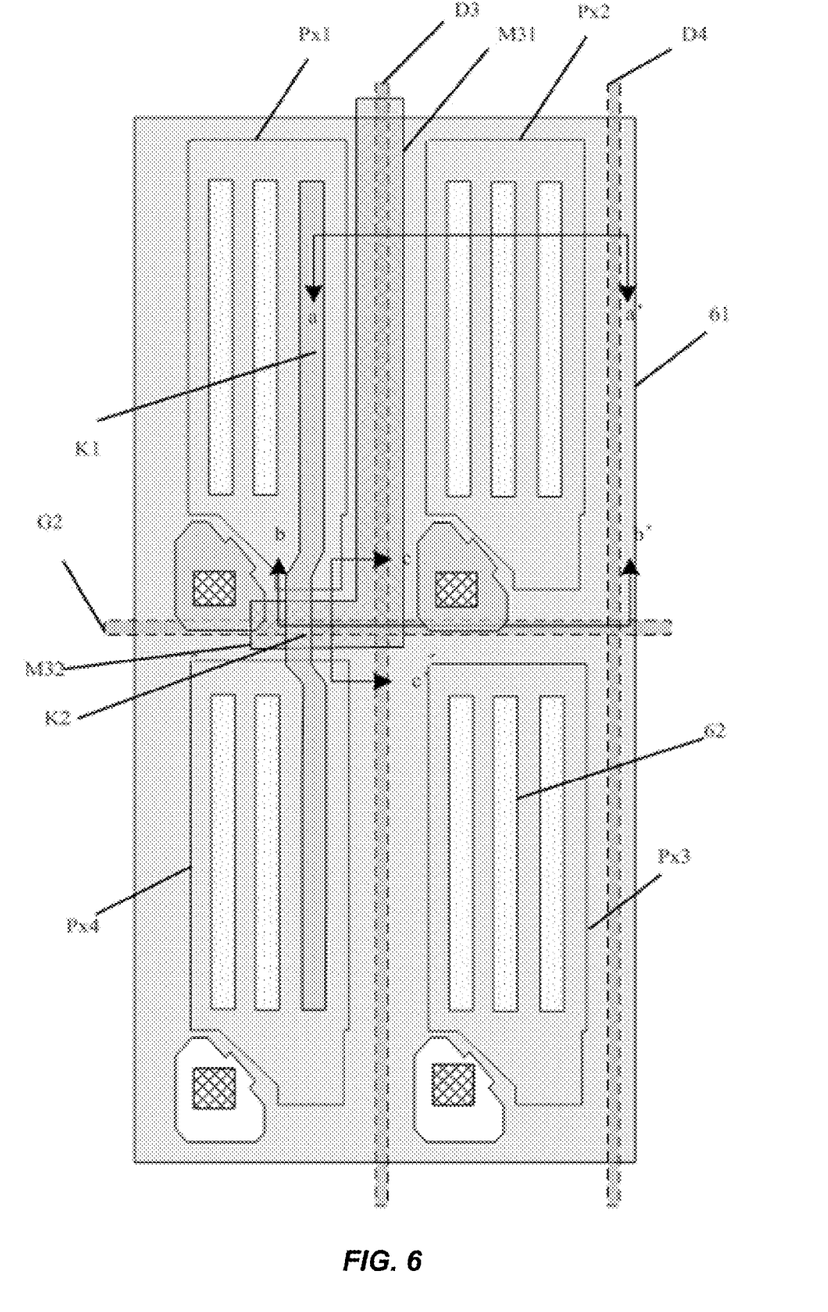
FIG. 6 is an enlarged partial view of another pixel unit structure of the array substrate shown in FIG. 1.

Specifically, reference is made to FIG. 6, which is an enlarged partial view of another pixel unit structure of the array substrate shown in FIG. 1, and the common electrode layer 61 is provided between the pixel electrodes and the substrate. In this case, since the pixel electrodes are provided on top, it is required to etch the respective pixel electrodes on top and form an electrode structure including a plurality of strip electrodes 62 in each pixel electrode to generate a controllable electric field between the pixel electrode and the common electrode layer 61 to drive a liquid crystal layer. The common electrode layer 61 may be fabricated into one or more strips in the region corresponding to each pixel electrode.

Figure 7:
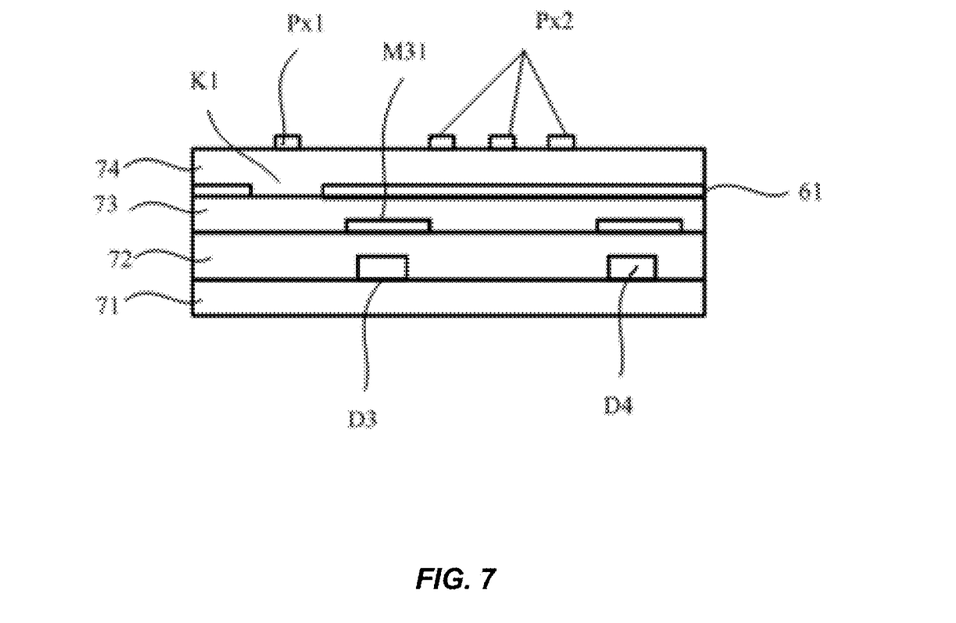
FIG. 7 is a sectional view of the array substrate shown in FIG. 6 along the direction of aa'.
Figure 8:
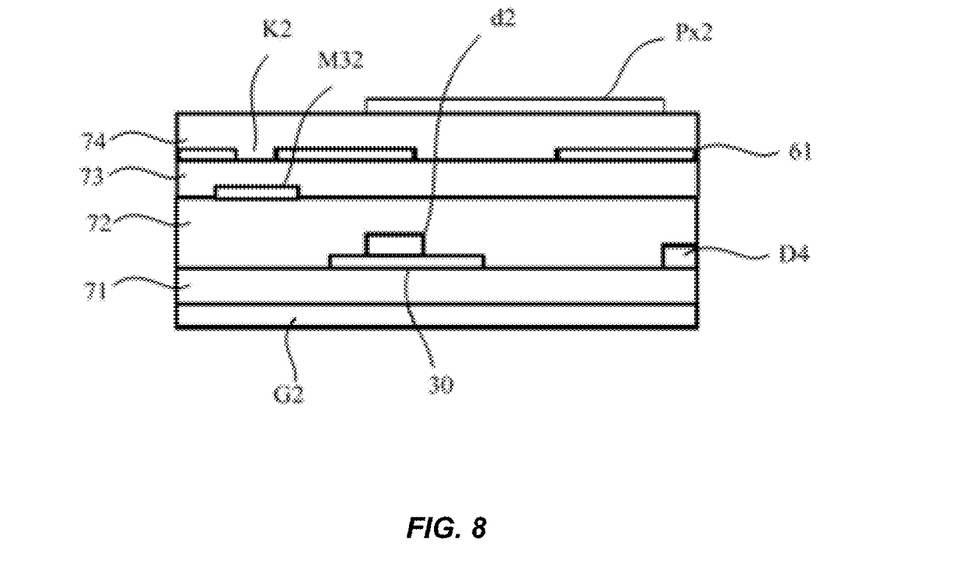
FIG. 8 is a sectional view of the array substrate shown in FIG. 6 along the direction of bb'.
Figure 9:
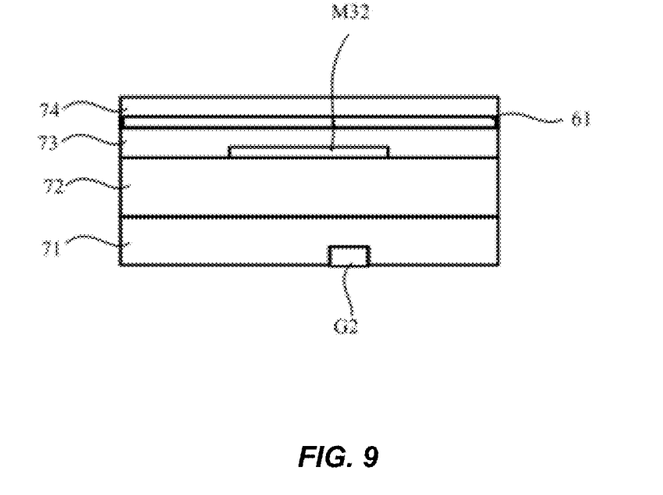
FIG. 9 is a sectional view of the array substrate shown in FIG. 6 along the direction of cc'.

Reference is made to FIG. 7 to FIG. 9, wherein FIG. 7 is a sectional view of the array substrate shown in FIG. 6 along the direction of aa', FIG. 8 is a sectional view of the array substrate shown in FIG. 6 along the direction of bb', and FIG. 9 is a sectional view of the array substrate shown in FIG. 6 along the direction of cc'. In the first pixel unit group 14: the gate line G2 is provided on the substrate surface; the gate line G2 is covered with the gate insulating layer 71; the active layer 30, the drain electrode d2 of the thin-film transistor of the second pixel unit P2 and the metal layer on which the data lines D3 and D4 locates are provided on the surface of the gate insulating layer 71; the first insulating layer 72 covers the surface of the drain electrode d2 and the data lines D3 and D4; the shielding electrode M31 and the shielding branch electrode M32 are provided on the first insulating layer 72; the second insulating layer 73 is provided on the surface of the shielding electrode M31 and the shielding branch electrode M32; the patterned common electrode layer 61 is provided on the surface of the second insulating layer 73, a first slot K1 is provided on the common electrode layer 61 in the region corresponding to the first pixel unit P1, and an aperture region K2 is provided in the common electrode layer at a place over the gate line between the pixel electrodes Px1 and Px4; the third insulating layer 74 is provided on the surface of the common electrode layer 61; the pixel electrodes Px1 and Px2 are provided on the surface of the third insulating layer 74.

To make a pixel electrode electrically connect to a corresponding drain electrode, it is required to provide a second via hole passing through the first insulating layer 72, the second insulating layer 73, and the third insulating layer 74 so as to make the pixel electrode electrically connect to the corresponding drain electrode through the second via hole. To make the common electrode electrically connect to the shielding electrode M31 or the shielding branch electrode M32, it is required to provide a first via hole passing through the second insulating layer 73 so as to make the common electrode electrically connect to the shielding electrode M31 or the shielding branch electrode M32 through the first via hole.

A second slot is provided in the common electrode in the extending direction of the gate line. The common electrode is partitioned in the direction of the gate line by the second slot to achieve the time divisional driving of the touch and display.

According to the embodiment, the aperture of the common electrode may run through several continuous pixel units in the column direction of the pixels as shown in FIG. 2 or FIG. 6.

It can be learn from the above description that, the aperture portion of the common electrode layer in the array substrate according to the embodiments of the disclosure is provided to include: the first slot at least partially overlapping the pixel electrode and an aperture region over the gate line. The first slot in the aperture portion of the common electrode is provided in the region facing the pixel unit without changing the location of the data line, rather than being provided between the pixel units in the conventional art, thus the configuration that the aperture portion facing the data line is avoided, the leakage of the electric field of the data line is avoided, and the problem of light leakage of the display panel is avoided. Meanwhile the aperture region in the aperture portion of the common electrode is provided between two adjacent pixel units in one pixel column and is provided over the gate line, thus only part of the gate line is exposed. In addition, the leakage of the electric field of the data line is avoided using the shielding branch electrode to avoid the problem of light leakage. So the problem of light leakage caused by the aperture of the common electrode may be avoided effectively by changing the location of the aperture portion of the common electrode and by providing the shielding branch electrode for the array substrate. Furthermore, the aperture portion of the array substrate may be fabricated with a greater width in the direction of the pixel row, thus the process difficulty of forming the aperture portion decreases, and the short-circuit of the common electrodes on both sides of the first slot is avoided.

Figure 10:
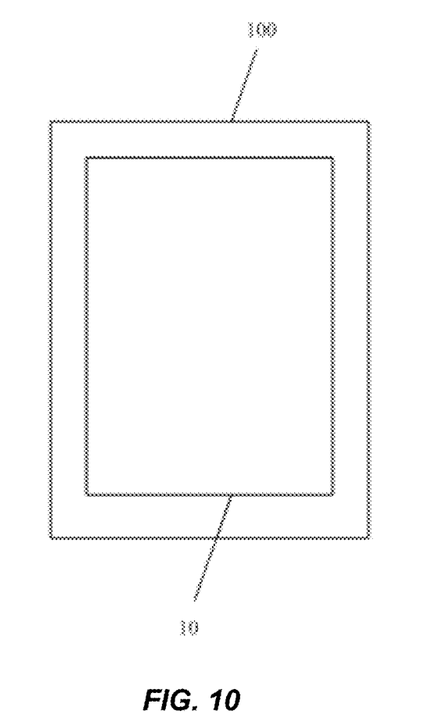
FIG. 10 is a structure diagram of a display panel according to an embodiment of the disclosure.

A display panel is further provided according to the embodiments of the disclosure, wherein the display panel includes the array substrate as described above. Reference is made to FIG. 10, which is a structure diagram of the display panel 100 according to an embodiment of the disclosure. The display panel 100 includes the array substrate 10 in any one of the above implementations according to the embodiments of the disclosure.

Figure 11:
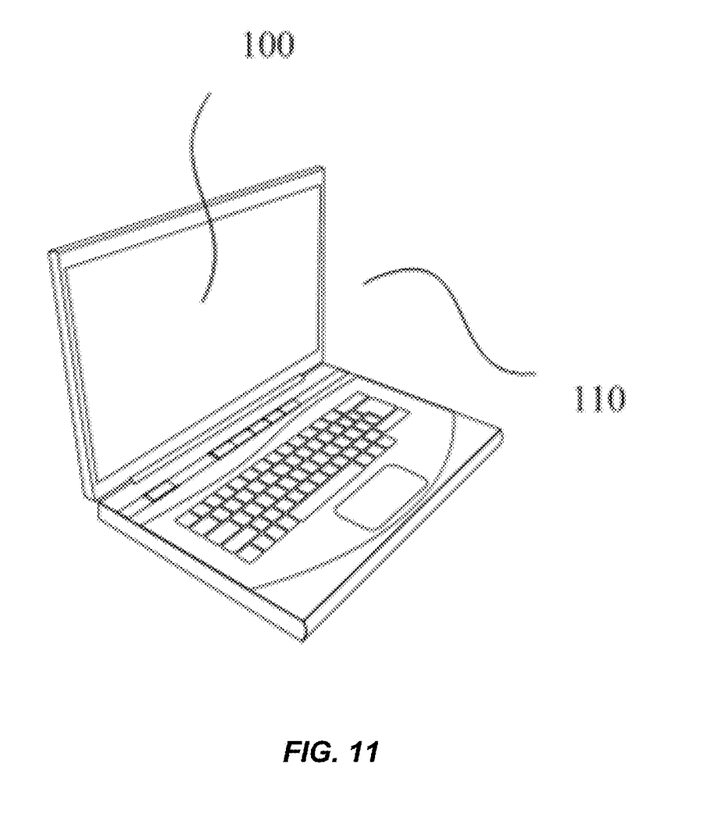
FIG. 11 is a structure diagram of a display device according to an embodiment of the disclosure.

A display device is further provided according to the embodiments of the disclosure, wherein the display device includes the display panel 100 as described above. Reference is made to FIG. 11, which is a structure diagram of the display device 110 according to the embodiment of the disclosure. The display device 110 includes the display panel 100 as described above.

The display device 110 may be a computer, or may be a cell phone or a wearable electronic device with a display function.

In the display panel 100 and the display device 110 including the array substrate 10 according to the embodiments of the disclosure, light leakage of the aperture region of the common electrode is avoided, and the display quality is improved; the width of the aperture region may be wider as compared to existing structures, the process difficulty decreases, and the short-circuit problem of the common electrodes on both sides of the aperture region is avoided.

Figure 12:
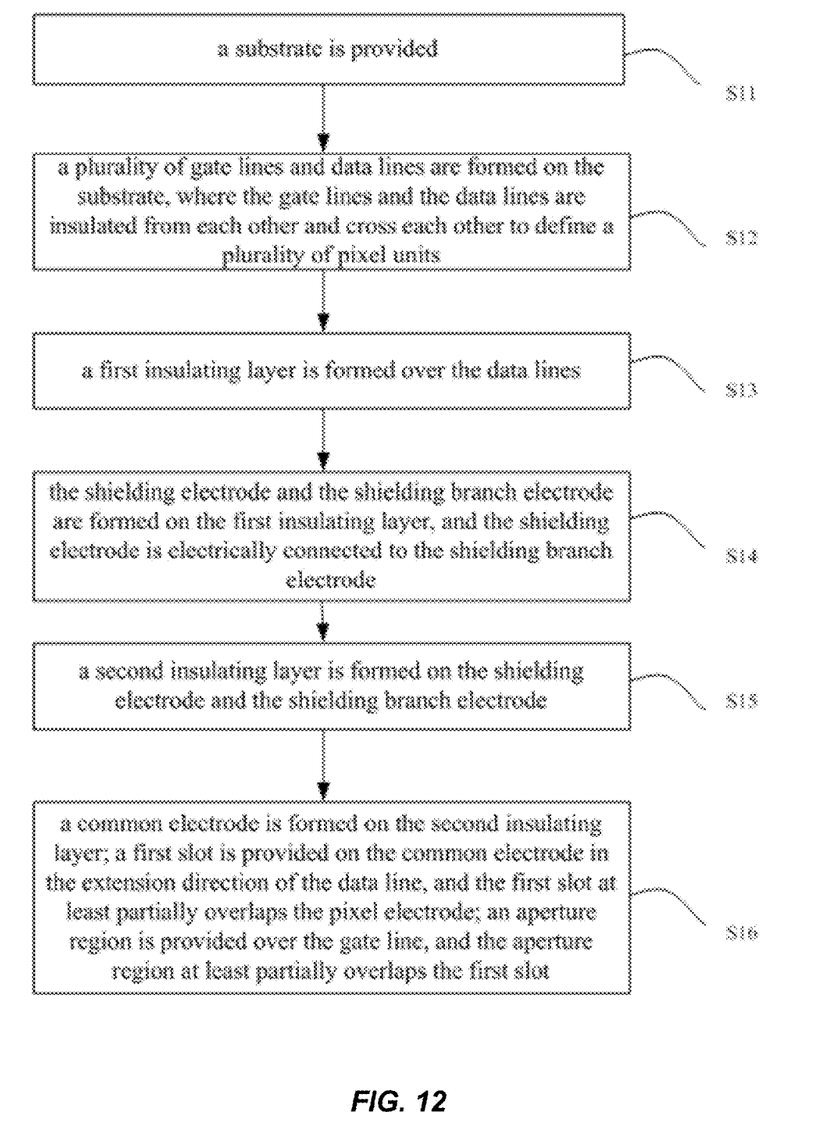
FIG. 12 is a flow chart of a method for manufacturing an array substrate according to an embodiment of the disclosure.

A method for manufacturing an array substrate is further provided according to the embodiments of the disclosure. Reference is made to FIG. 12, which is a flow chart of the method for manufacturing an array substrate according to an embodiment of the disclosure. The manufacture method includes steps S11 to S16.

In step S11, a substrate is provided.

The substrate is a transparent substrate, such as a glass plate.

In step S12, a plurality of gate lines and data lines are formed on the substrate, wherein the gate lines and the data lines are insulated from each other and cross each other to define a plurality of pixel units.

Referring to the implementation in FIG. 1, the plurality of pixel units are arranged in an array. The pixel units include pixel electrodes and common electrodes.

In step S13, a first insulating layer is formed over the data lines.

The first insulating layer may be formed by oxidation or deposition process. Depending on the specific structure of the pixel units, the first insulating layer may be a single-layered insulating layer or a multilayered insulating layer. According to the implementation shown in FIG. 3, the insulating layers 32 and 33 are provided between the data line D3 and the shielding electrode M31, and the first insulating layer in this case is a double-layered insulating layer. According to the implementation shown in FIG. 7, the insulating layer 72 is provided between the data line D3 and the shielding electrode M31, and the first insulating layer in this case is a single-layered insulating layer.

In step S14, the shielding electrode and the shielding branch electrode are formed on the first insulating layer, and the shielding electrode is electrically connected to the shielding branch electrode.

In step S15, a second insulating layer is formed on the shielding electrode and the shielding branch electrode.

No matter in the case that the pixel electrodes are located between the substrate and the common electrodes, or in the case that the common electrodes are located between the substrate and the pixel electrodes, the second insulating layer is usually a single-layered insulating layer. According to the implementation shown in FIG. 3, the insulating layer 34 is formed between the shielding electrode M31 and the common electrode layer 21, and according to the implementation shown in FIG. 7, the insulating layer 74 is formed between the shielding electrode M31 and the common electrode layer 61.

In step S16, a common electrode is formed on the second insulating layer; a first slot is provided on the common electrode in the extension direction of the data line, and the first slot at least partially overlaps the pixel electrode; an aperture region is provided over the gate line, and the aperture region at least partially overlaps the first slot.

The first slot and the data line are separated from each other and would not overlap with each other, to avoid the leakage of the electric field of the data line and light leakage of the display panel.

The projection of the shielding electrode onto the data line overlaps the data line; the shielding branch electrode is provided in the aperture region, and the projection of the shielding branch electrode onto the gate line partially overlaps the gate line. The shielding branch electrode is used to avoid the leakage of the electric field of the gate line under the aperture region and to avoid light leakage of the display panel.

A first via hole is formed in the second insulating layer, and the common electrode layer is electrically connected to the shielding branch electrode through the first via hole. The shielding branch electrode or the shielding electrode is used as the signal line of the common electrode to be used for touch driving or display driving.

Before the step of forming the first insulating layer over the data lines, the method further includes the following: gate electrodes electrically connected to the gate lines are formed on the substrate, a gate insulating layer is formed on the gate electrodes, an active layer is formed on gate insulating layer, and source electrodes, drain electrodes, and the metal layer on which the data lines locate are formed on the active layer, pixel electrodes are formed on the source electrodes, the drain electrodes and the metal layer on which the data lines locate, the pixel electrodes are electrically connected to the drain electrodes, and the first insulating layer is formed on the pixel electrodes. According to the implementation of the disclosure, the pixel electrodes are provided between the common electrodes and the substrate; the method according to the implementation may be used to manufacture the array substrate with the structure shown in FIG. 2-FIG. 5, and it is required in the implementation that the common electrodes are formed into strip electrode structures. The specific process includes: forming gate lines and a metal layer, on which the gate lines locate, on the surface of the substrate, patterning the metal layer to form the gate lines and the gate electrodes electrically connected to the gate lines, forming a gate insulating layer on the gate electrodes, forming an active layer on the gate insulating layer, forming source electrodes and drain electrodes as well as the metal layer, on which the data lines locates, on the active layer, forming pixel electrodes on the source electrodes and drain electrodes as well as the metal layer on which the data lines locate, wherein the pixel electrodes are electrically connected to the drain electrodes, and forming the first insulating layer on the pixel electrodes.

The above is just one implementation according to the embodiments of the disclosure, and in another implementation, before the step of forming the first insulating layer over the data lines, the method further includes: forming gate electrodes electrically connected to the gate lines on the substrate, forming the gate insulating layer on the gate electrodes, forming the active layer on the gate insulating layer, forming on the active layer source electrodes and drain electrodes as well as the metal layer on which the data lines locate, forming the first insulating layer on the source electrodes and drain electrodes as well as metal layer on which the data lines locate. After the step of forming common electrodes on the second insulating layer, the following are included: forming a third insulating layer on the common electrode layer, and forming the pixel electrodes on the third insulating layer, wherein a second via hole is formed on each of the first, second and third insulating layers, and the pixel electrode is electrically connected to the drain electrode through the second via hole. According to the implementation, common electrodes are provided between the substrate and pixel electrodes; and the method according to the implementation may be used to manufacture the array substrate with the structure shown in FIG. 6-FIG. 9, and it is required in this implementation that the pixel electrodes are formed into strip electrode structure according to the implementation of the disclosure. The specific process includes: forming on the surface of the substrate gate lines and a metal layer on which the gate lines locate, patterning the metal layer to form the gate lines and the gate electrodes electrically connected to the gate lines, forming a gate insulating layer on the gate electrodes, forming an active layer on the gate insulating layer, forming on the active layer source electrodes and drain electrodes as well as a metal layer on which the data lines locate, forming the first insulating layer on the source electrodes and drain electrodes as well as the metal layer on which the data lines locate; then after steps S14, S15 and S16, forming a third insulating layer on the common electrode layer, and forming the pixel electrodes on the third insulating layer.

In the manufacture method according to the embodiments of the disclosure, in manufacturing an array substrate, the aperture portion of the common electrode layer and data lines are separated from each other, and the light leakage problem of aperture region of the common electrodes is avoided, thus the display quality is guaranteed. Meanwhile, since no data line is provided under the aperture portion, the width of the aperture portion may increase correspondingly, so the technology difficulty of the manufacture method is reduced, and then the manufacture efficiency is improved as well as the cost is lowered.

It should be noted that the manufacture method according to the embodiments of the disclosure is based on the array substrate with the above structure, and for the structure of the array substrate, reference is made to the appending drawings of the embodiments of the array substrate. The similarities between the embodiments of the manufacture method and the embodiments of the above structure may be supplemental for each other, and need not to be repeated here.

The above description of the embodiments of the disclosure is to enable those skilled in the art to implement or use the invention. Various modifications made to the embodiments are apparent to those skilled in the art, and the general principles defined in the disclosure may be implemented in other embodiments without departing from the spirit and scope of the invention. Hence, the invention is not limited to the embodiments described in the disclosure, but conforms to a widest scope consistent with the principles and novel features in the disclosure.

What is claimed is:

1. An array substrate, comprising:
   a substrate;
   a plurality of gate lines disposed on the substrate;
   a plurality of data lines disposed on the substrate, wherein the gate lines and the data lines are insulated from each other and cross each other to define a plurality of pixel units, and wherein the pixel units comprise a plurality of pixel electrodes and common electrodes,
   wherein the common electrode comprises a first slot extending in a direction of the data lines, wherein the first slot at least partially overlaps at least one of the pixel electrodes,
   wherein the gate lines each comprise an aperture region, wherein the aperture region of each gate line at least partially overlaps at least one of the first slots,
   wherein a plurality of shielding electrodes and a plurality of shielding branch electrodes electrically connected to the shielding electrodes are provided over the data lines in the direction of the data lines, wherein a projection of the shielding electrode onto the data line at least partially overlaps the data line; the shielding branch electrode is provided in the aperture region, and a projection of the shielding branch electrode onto the gate line at least partially overlaps the gate line.

2. The array substrate according to claim 1, wherein a second insulating layer is provided between the shielding electrode and the common electrode, wherein the second insulating layer is between the shielding branch electrode and the common electrode, wherein a first via hole is provided in the second insulating layer, and wherein the common electrode is electrically connected to the shielding branch electrode or the shielding electrode through the first via hole.

3. The array substrate according to claim 2, wherein the pixel electrode is provided between the shielding electrode and the data line.

4. The array substrate according to claim 2, wherein the common electrode is provided between the pixel electrode and the shielding electrode.

5. The array substrate according to claim 1, wherein a second slot is provided in the common electrode in a direction of the gate line.

6. A display device, comprising:
   an array substrate, the array substrate comprising:
   a substrate;
   a plurality of gate lines disposed on the substrate;
   a plurality of data lines disposed on the substrate, wherein the gate lines and the data lines are insulated from each other and cross each other, wherein the data lines and gate lines are connected to a plurality of pixel units, and wherein the pixel units comprise a plurality of pixel electrodes and common electrodes,
   wherein the common electrode comprises a first slot extending in a direction of the data lines, wherein each first slot at least partially overlaps at least one of the pixel electrodes,
   wherein the gate lines each comprise an aperture region, wherein the aperture region of each gate line at least partially overlaps at least one of the first slots,
   wherein a plurality of shielding electrodes and a plurality of shielding branch electrodes electrically connected to the shielding electrodes are provided over the data lines in the direction of the data lines, wherein a projection of the shielding electrode onto the data line at least partially overlaps the data line; the shielding branch electrode is provided in the aperture region, and a projection of the shielding branch electrode onto the gate line at least partially overlaps the gate line.

7. A method for manufacturing an array substrate, comprising:
   providing a substrate,
   forming a plurality of gate lines on the substrate;
   forming a plurality of data lines on the substrate, wherein the gate lines and the data lines are insulated from each other and cross each other to define a plurality of pixel units, and wherein the pixel units comprise a plurality of pixel electrodes and common electrodes;
   forming a first insulating layer over the data line;
   forming a shielding electrode and a shielding branch electrode on the first insulating layer, wherein the shielding electrode and the shielding branch electrode are electrically connected;
   forming a second insulating layer on the shielding electrode and the shielding branch electrode; and
   forming the common electrodes on the second insulating layer, wherein a first slot is provided in the common electrode, the first slot extending in a direction of the data lines, wherein the first slot partially overlap the pixel electrodes; wherein an aperture region is formed over each gate line, wherein the aperture region of each gate line partially overlaps the first slot,
   wherein a projection of the shielding electrode onto the data line partially overlaps the data line; the shielding branch electrode is provided in the aperture region, and a projection of the shielding branch electrode onto the gate line partially overlaps the gate line.

8. The method according to claim 7, wherein a first via hole is provided in the second insulating layer, and wherein the common electrode is electrically connected to the shielding branch electrode through the first via hole.

9. The method according to claim 8, wherein, before forming the first insulating layer over the data line, the method further comprises:
   forming, on the substrate, a gate electrode electrically connected to the gate line;
   forming a gate insulating layer on the gate electrode;
   forming an active layer on gate insulating layer;
   forming, on the active layer, a source electrode, a drain electrode, and a metal layer for the data line;
   forming the pixel electrode on the source electrode, on the drain electrode, and on the metal layer, wherein the pixel electrode is electrically connected to the drain electrode; and
   forming the first insulating layer on the pixel electrode.

10. The method according to claim 8, wherein, before forming the first insulating layer over the data line, the method further comprises:
    forming, on the substrate, a gate electrode electrically connected to the gate line;

forming a gate insulating layer on the gate electrode;
forming an active layer on the gate insulating layer;
forming, on the active layer, a source electrode, a drain electrode, and a metal layer for the data line; and
forming the first insulating layer on the source electrode, on the drain electrode, and on the metal layer.

11. The method according to claim 10, wherein, after forming the common electrode on the second insulating layer, the method further comprises:
forming a third insulating layer on the common electrode layer; and
forming the pixel electrode on the third insulating layer, wherein a second via hole is formed on each of the first, second, and third insulating layers, and wherein the pixel electrode is electrically connected to the drain electrode through the second via hole.

\* \* \* \* \*